United States Patent
Sewell et al.

(10) Patent No.: US 10,593,825 B2
(45) Date of Patent: *Mar. 17, 2020

(54) ROLL-TO-ROLL METALLIZATION OF SOLAR CELLS

(71) Applicant: SunPower Corporation, San Jose, CA (US)

(72) Inventors: Richard Hamilton Sewell, Los Altos, CA (US); Gabriela Elena Bunea, San Jose, CA (US)

(73) Assignee: SunPower Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/233,868

(22) Filed: Dec. 27, 2018

(65) Prior Publication Data

US 2019/0131487 A1    May 2, 2019

Related U.S. Application Data (63) Continuation of application No. 15/154,821, filed on May 13, 2016.

(51) Int. Cl.
*H01L 31/18* (2006.01)
*H01L 31/068* (2012.01)
(Continued)

(52) U.S. Cl.
CPC .. *H01L 31/1876* (2013.01); *H01L 31/022441* (2013.01); *H01L 31/0488* (2013.01);
(Continued)

(58) Field of Classification Search
None
See application file for complete search history.

(56) References Cited

U.S. PATENT DOCUMENTS

| 3,993,533 A | 11/1976 | Milnes et al. |
| 4,058,418 A | 11/1977 | Lindmayer |

(Continued)

FOREIGN PATENT DOCUMENTS

| CN | 102132423 | 7/2011 |
| DE | 10020412 | 11/2001 |

(Continued)

OTHER PUBLICATIONS

Internationai Search Report and Written Opinion from PCT/US2017/032296 dated Jul. 24, 2017, 14 pgs.

(Continued)

*Primary Examiner* — Angel Roman
(74) *Attorney, Agent, or Firm* — Schwabe, Williamson & Wyatt, P.C.

(57) ABSTRACT

Disclosed herein are approaches to fabricating solar cells, solar cell strings and solar modules using roll-to-roll foil-based metallization approaches. Methods disclosed herein can comprise the steps of providing at least one solar cell wafer on a first roll unit and conveying a metal foil to the first roll unit. The metal foil can be coupled to the solar cell wafer on the first roll unit to produce a unified pairing of the metal foil and the solar cell wafer. We disclose solar energy collection devices and manufacturing methods thereof enabling reduction of manufacturing costs due to simplification of the manufacturing process by a high throughput foil metallization process.

20 Claims, 8 Drawing Sheets

(51) Int. Cl.
*H01L 31/048* (2014.01)
*H01L 31/05* (2014.01)
*H01L 31/0224* (2006.01)

(52) U.S. Cl.
CPC ...... *H01L 31/0512* (2013.01); *H01L 31/0516* (2013.01); *H01L 31/0682* (2013.01); *H01L 31/18* (2013.01); *H01L 31/188* (2013.01); *Y02E 10/547* (2013.01); *Y02P 70/521* (2015.11)

(56) References Cited

U.S. PATENT DOCUMENTS

| | | | |
|---|---|---|---|
| 4,318,938 | A | 3/1982 | Barnett et al. |
| 4,393,576 | A | 7/1983 | Dahlberg |
| 4,400,577 | A | 8/1983 | Spear |
| 4,433,200 | A | 2/1984 | Jester et al. |
| 4,461,922 | A | 7/1984 | Gay et al. |
| 4,482,780 | A | 11/1984 | Mitchell |
| 4,581,103 | A | 4/1986 | Levine et al. |
| 4,582,588 | A | 4/1986 | Jensen et al. |
| 4,617,421 | A | 10/1986 | Nath et al. |
| 4,691,076 | A | 9/1987 | Levine et al. |
| 4,695,674 | A | 9/1987 | Bar-on |
| 4,697,041 | A | 9/1987 | Okaniwa et al. |
| 4,882,298 | A | 11/1989 | Moeller et al. |
| 4,917,752 | A | 4/1990 | Jensen et al. |
| 4,957,601 | A | 9/1990 | Levine et al. |
| 5,091,319 | A | 2/1992 | Hotchkiss et al. |
| 5,273,608 | A | 12/1993 | Nath |
| 5,380,371 | A | 1/1995 | Murakami |
| 5,951,786 | A | 9/1999 | Gee et al. |
| 5,980,679 | A | 11/1999 | Severin et al. |
| 6,159,832 | A | 12/2000 | Mayer |
| 6,288,326 | B1 | 9/2001 | Hayashi et al. |
| 6,448,155 | B1 | 9/2002 | Iwasaki et al. |
| 6,635,307 | B2 | 10/2003 | Huang et al. |
| 7,355,114 | B2 | 4/2008 | Ojima et al. |
| 8,003,530 | B2 | 8/2011 | Grohe et al. |
| 8,146,643 | B2 | 4/2012 | Kasahara et al. |
| 8,766,090 | B2 | 7/2014 | Sewell et al. |
| 8,809,192 | B2 | 8/2014 | Bertram et al. |
| 9,040,409 | B2 | 5/2015 | Kumar et al. |
| 10,290,763 | B2 * | 5/2019 | Sewell ............... H01L 31/0488 |
| 2005/0253142 | A1 | 11/2005 | Negami et al. |
| 2006/0166023 | A1 | 7/2006 | Yoshikata et al. |
| 2008/0042153 | A1 | 2/2008 | Beeson et al. |
| 2008/0128019 | A1 | 6/2008 | Lopatin et al. |
| 2008/0216887 | A1 | 9/2008 | Hacke et al. |
| 2008/0223429 | A1 | 9/2008 | Everett et al. |
| 2009/0194162 | A1 | 8/2009 | Sivaram et al. |
| 2010/0032013 | A1 | 2/2010 | Krause et al. |
| 2010/0200058 | A1 | 8/2010 | Funakoshi |
| 2010/0218897 | A1 | 9/2010 | Frolov et al. |
| 2010/0243041 | A1 | 9/2010 | Carlson et al. |
| 2012/0103408 | A1 | 5/2012 | Moslehi et al. |
| 2012/0208411 | A1 | 8/2012 | Krokoszinski et al. |
| 2012/0240995 | A1 | 9/2012 | Coakley et al. |
| 2013/0160825 | A1 | 6/2013 | Lantzer et al. |
| 2013/0183796 | A1 | 7/2013 | Stewart et al. |
| 2013/0203204 | A1 | 8/2013 | Hiraike et al. |
| 2013/0210186 | A1 | 8/2013 | Hiraike et al. |
| 2013/0269768 | A1 | 10/2013 | Skorelid et al. |
| 2014/0174519 | A1 | 6/2014 | Rim et al. |
| 2014/0352777 | A1 | 12/2014 | Hachtmann et al. |
| 2014/0373892 | A1 | 12/2014 | Bergmann et al. |
| 2015/0079723 | A1 | 3/2015 | Ahmed et al. |
| 2017/0062633 | A1 | 3/2017 | Carlson et al. |
| 2017/0330993 | A1 * | 11/2017 | Sewell ............... H01L 31/0488 |

FOREIGN PATENT DOCUMENTS

| | | |
|---|---|---|
| EP | 1634673 | 3/2006 |
| JP | 2003/246971 | 9/2003 |
| WO | WO 1999/040760 | 8/1999 |
| WO | WO 2010/025269 | 3/2010 |
| WO | WO 2012/135395 | 10/2012 |
| WO | WO 2013/182955 | 12/2013 |

OTHER PUBLICATIONS

International Preliminary Report on Patentability from PCT/US2017/032296 dated Nov. 13, 2018, 10 pgs.

Cotter, et al., "Novel Process for Simplified Buried Contact Solar Cells," Institute of Electrical and Electronics Engineers, Aug. 2000, pp. 303-306.

* cited by examiner

ROLL-TO-ROLL METALLIZATION OF SOLAR CELLS

CROSS-REFERENCE TO RELATED APPLICATIONS

This application is a continuation of U.S. patent application Ser. No. 15/154,821, filed on May 13, 2016, the entire contents of which are hereby incorporated by reference herein.

BACKGROUND

Photovoltaic (PV) cells, commonly known as solar cells, are well known devices for direct conversion of solar radiation into electrical energy. Generally, solar cells are fabricated on a semiconductor wafer or substrate using semiconductor processing techniques to form a p-n junction near a surface of the wafer. Solar radiation impinging on the surface of, and entering into, the wafer creates electron and hole pairs in the bulk of the wafer. The electron and hole pairs migrate to p-doped and n-doped regions in the wafer, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers. The figures are not drawn to scale.

DETAILED DESCRIPTION

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Certain terminology may be used in the following description for the purpose of reference only, and thus are not intended to be limiting. For example, terms such as "upper", "lower", "above", and "below" refer to directions in the drawings to which reference is made. Terms such as "front", "back", "rear", "side", "axial", and "lateral" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

Terminology

The following paragraphs provide definitions and/or context for terms found in this disclosure (including the appended claims):

This specification includes references to "one embodiment" or "an embodiment." The appearances of the phrases "in one embodiment" or "in an embodiment" do not necessarily refer to the same embodiment. Particular features, structures, or characteristics can be combined in any suitable manner consistent with this disclosure.

This term "comprising" is open-ended. As used in the appended claims, this term does not foreclose additional structure or steps.

Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

As used herein, the terms "first," "second," etc. are used as labels for nouns that they precede, and do not imply any type of ordering (e.g., spatial, temporal, logical, etc.). For example, reference to a "first" encapsulant layer does not necessarily imply that this encapsulant layer is the first encapsulant layer in a sequence; instead the term "first" is used to differentiate this encapsulant from another encapsulant (e.g., a "second" encapsulant).

The terms "a" and "an" are defined as one or more unless this disclosure explicitly requires otherwise.

The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

As used herein, "inhibit" is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

As used herein, the term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" may be substituted with "within [a percentage] of" what is specified, where the percentage includes 0.1, 1, 5, and 10 percent.

As used herein, "regions" can be used to describe discrete areas, volumes, divisions or locations of an object or material having definable characteristics but not always fixed boundaries.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present invention. The feature or features of one embodiment can be applied to other embodiments, even though not described or illustrated, unless expressly prohibited by this disclosure or the nature of the embodiments.

Although many of the examples described herein are back contact solar cells, the techniques and structures apply equally to other (e.g., front contact) solar cells as well. Moreover, although much of the disclosure is described in terms of solar cells, the disclosed techniques and structures apply equally to other semiconductor structures (e.g., silicon wafers, or large area light emitting diodes, or substrates generally).

Methods of fabricating solar cells using roll-to-roll foil-based metallization approaches, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells, solar cell strings and solar modules. In one embodiment, a method of fabricating a solar cell includes providing at least one wafer or substrate on a first roll unit. In an embodiment, a silicon substrate of a solar cell is provided on the first roll unit. The solar cell can comprise a plurality of semiconductor regions in and/or above the wafer or substrate. The method further comprises a step of conveying a metal foil to the first roll unit. The metal foil contacts the wafer of a solar cell on the first roll unit. Additionally, the method comprises the step of coupling the metal foil to the wafer to provide a unified pairing of the metal foil and the wafer to form a metallized solar cell.

Also disclosed herein are solar cells, solar cell strings and solar modules fabricated in a roll-to-roll foil-based metallization approach. In an embodiment, a solar cell includes a wafer or substrate. In an embodiment, a plurality of semiconductor regions are disposed in and/or above the substrate. The solar cell comprises a patterned metal foil coupled to the wafer. In an embodiment, the patterned metal foil comprises electrically isolated regions corresponding to and/or in alignment with the plurality of semiconductor regions.

One or more embodiments described herein provide for roll-to-roll foil-based metallization approaches. Advantages include reduction of the cost of manufacturing a solar cells, strings and modules due to simplification of the manufacturing process by a high throughput foil metallization process. The roll-to-roll foil-based metallization approaches described herein enable low cost and efficient solar cell metallization without electroplating.

Figure 1:
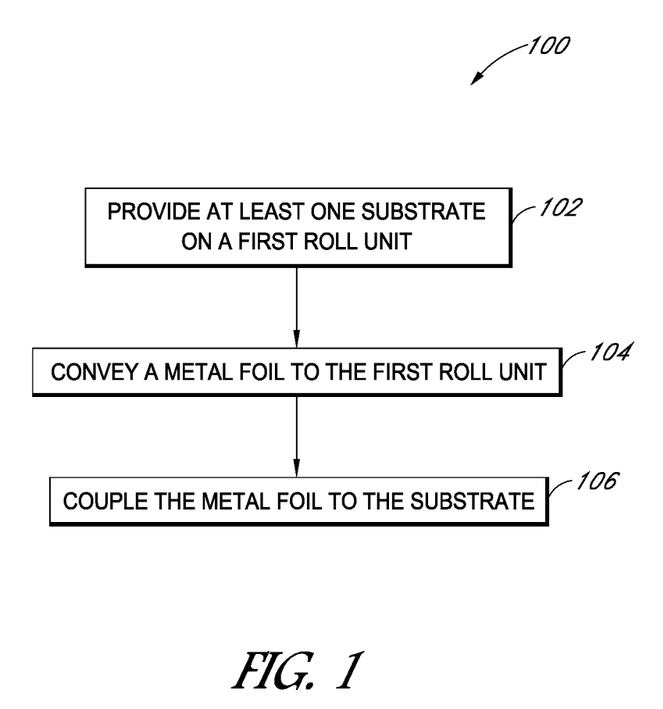
FIG. 1 depicts operations in a method of fabricating a solar cell or solar cell string, in accordance with an embodiment of the present disclosure.

FIG. 1 depicts a flowchart 100 listing operations in a method of fabricating a solar cell, in accordance with an embodiment of the present disclosure. Referring to operation 102 of flowchart 100 and to corresponding FIG. 2, a method of fabricating a solar cell or solar cell string comprises providing at least one wafer of a solar cell 112 on a first roll unit 120. The first roll unit 120 rotates the solar cell wafers 112 along a first conveyance path generally depicted at 122. For ease of description, individual wafers at particular positions along the first roll unit 120 are indicated by 112a, 112b, and 112n.

Figure 2:
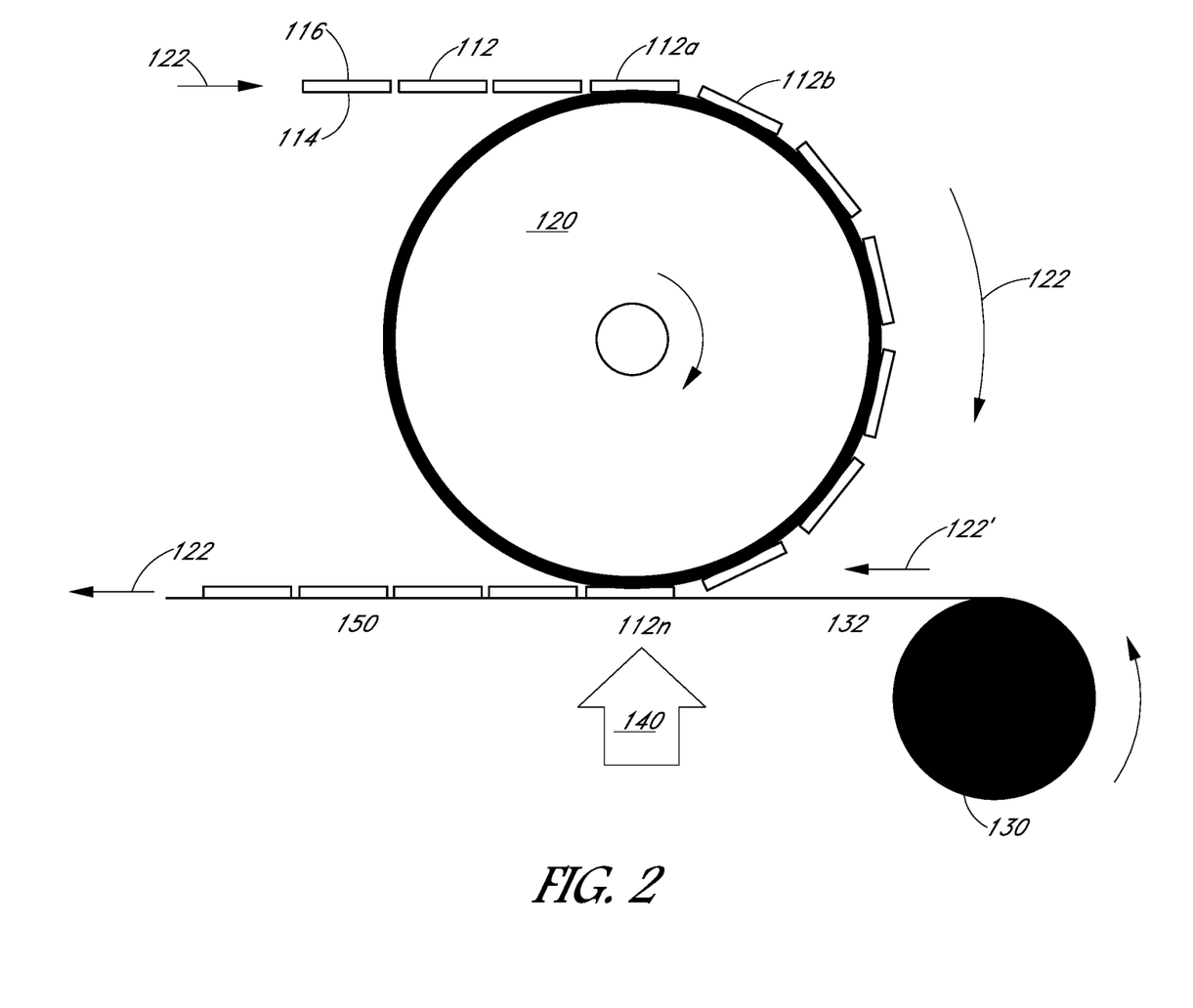
FIG. 2 depicts a method of fabricating a solar cell or solar cell string, in accordance with an embodiment of the present disclosure.

In one embodiment, each wafer of a solar cell 112 comprises a monocrystalline silicon substrate. For example, wafer of solar cell 112 comprises an n-type or a p-type monocrystalline silicon substrate. In other embodiments, wafer of solar cell 112 comprises an n-type or a p-type multi-crystalline silicon substrate. In yet other embodiments, wafer of solar cell 112 comprises an amorphous silicon substrate. In one embodiment, the thickness of the wafer is less than 300 μm. As another example, the thickness of the wafer is less than 150 μm. In some embodiments, the wafer thickness can be between 50-300 μm.

In an embodiment, each wafer of a solar cell 112 comprises a front side 114 facing the sun during normal operation to collect solar radiation and a back side 116 opposite the front side. As depicted in FIG. 2, the front sides 114 contact the first roll unit 120. In one embodiment, the solar cell 112 is a back contact solar cell, however the techniques and structures apply equally to other (e.g., front contact) solar cells as well.

In an embodiment, each solar cell 112 comprises a plurality of semiconductor regions on and/or above a substrate. For example solar cells 112 can comprise alternating n-type and p-type polycrystalline silicon semiconductor regions on and/or above a silicon substrate.

Figure 3A:
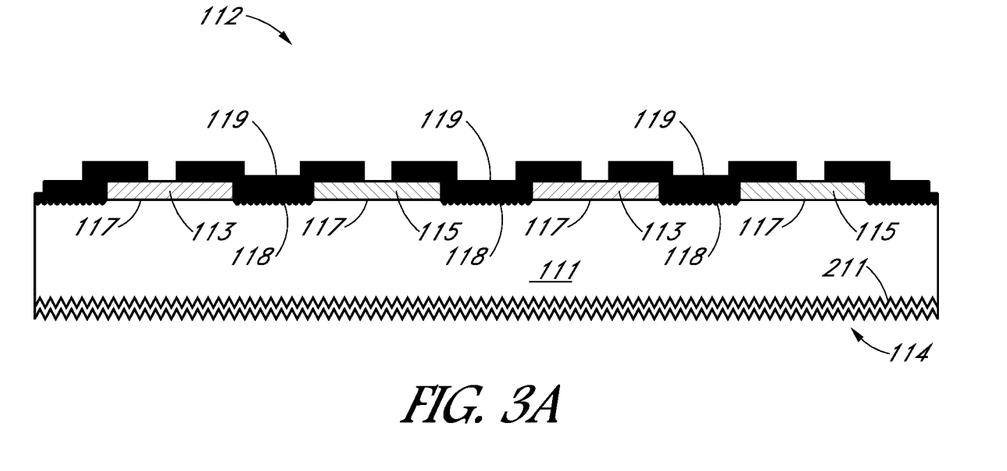
FIG. 3A and FIG. 3B depicts solar cells, in accordance with an embodiment of the present disclosure.

In some embodiments, a method of fabricating a solar cell includes forming a plurality of semiconductor regions in and/or above a substrate. For example, FIG. 3A depicts solar cell wafer 112 according to one embodiment. Solar cell wafer 112 comprises a plurality of semiconductor regions 113/115 in and/or above substrate 111. In some embodiments, a thin dielectric material 117 may be included as an intervening material between the semiconductor regions 113/115 and the substrate 111. The substrate 111 has a light-receiving surface 114 opposite a back surface above which the plurality of semiconductor regions 113/115 is formed. In an embodiment, as depicted in FIG. 3A, each of the plurality of semiconductor regions 113/115 is spaced apart from one another. In a specific embodiment, the plurality of semiconductor regions 113/115 is a plurality of alternating n-type 113 and p-type 115 semiconductor regions.

In an embodiment, the substrate 111 is a monocrystalline silicon substrate, such as a bulk single crystalline n-type doped silicon substrate. It is to be appreciated, however, that substrate 111 may be a layer, such as a multi-crystalline silicon layer, disposed on a global solar cell substrate. In an embodiment, the thin dielectric layer 117 is a tunneling silicon oxide layer having a thickness of approximately 2 nanometers or less. In one such embodiment, the term "tunneling dielectric layer" refers to a very thin dielectric layer, through which electrical conduction can be achieved. Not to be bound by any particular theory, but the conduction may be due to quantum tunneling and/or the presence of small regions of direct physical connection through thin spots in the dielectric layer. In one embodiment, the tunneling dielectric layer is or includes a thin silicon oxide layer.

In an embodiment, in the case that the plurality of semiconductor regions 113/115 is a plurality of alternating n-type 113 and p-type 115 semiconductor regions, the alternating n-type and p-type semiconductor regions 113 and 115, respectively, are polycrystalline silicon regions formed by, e.g., using a plasma-enhanced chemical vapor deposition (PECVD) process. In one such embodiment, the n-type polycrystalline silicon regions 113 are doped with an n-type impurity, such as phosphorus. The P-type polycrystalline silicon regions 204 are doped with a P-type impurity, such as boron. As is depicted in FIG. 3A, the alternating n-type and p-type semiconductor regions 113 and 115 may have trenches 118 formed there between, the trenches 118 extending partially into the substrate 111. In an embodiment, an insulating layer 119 is disposed in the trenches 118 and between and partially on the alternating n-type and p-type semiconductor regions 113 and 115, as is depicted in FIG. 3A. In some embodiments, a bottom anti-reflective coating (BARC) material or other protective layer (such as a layer amorphous silicon) is formed on the alternating n-type 113 and p-type 115 semiconductor regions.

In an embodiment, the light receiving surface 114 is a texturized light receiving surface, as is depicted in FIG. 3A. In one embodiment, a hydroxide-based wet etchant is employed to texturize the light receiving surface 114 of the substrate 111 and, possibly, the trench 118 surfaces as is also depicted in FIG. 3A. It is to be appreciated that the timing of the texturizing of the light receiving surface may vary. For example, the texturizing may be performed before or after the formation of the thin dielectric layer 117. In an embodiment, a texturized surface may be one which has a regular or an irregular shaped surface for scattering incoming light, decreasing the amount of light reflected off of the light receiving surface 114 of the solar cell. Referring again to FIG. 3A, additional embodiments can include formation of a passivation and/or anti-reflective coating (ARC) layers (shown collectively as layer 212) on the light receiving surface 114. It is to be appreciated that the timing of the formation of passivation and/or ARC layers may also vary.

In an embodiment, the plurality of semiconductor regions 113/115 is formed from a polycrystalline silicon layer formed above the substrate 111, which may be a single or multi-crystalline silicon substrate, as described above. In another embodiment, however, the substrate 111 is a single crystalline silicon substrate having the plurality of semiconductor regions 113/115 formed therein, as opposed to being formed in a semiconductor layer distinct from the substrate 111.

A plurality of contact openings can be formed in insulating layer 119. The plurality of contact openings can provide exposure to the plurality of n-type doped polysilicon regions 113 and to the plurality of p-type doped polysilicon regions 115. In one embodiment, the plurality of contact openings is formed by laser ablation. In one embodiment, the contact openings to the n-type doped polysilicon regions 113 have substantially the same height as the contact openings to the p-type doped polysilicon regions 115.

In an embodiment, the first roll unit 120 is an elongated cylindrical device comprising a circular cross-section such as depicted in FIG. 2. In other embodiments, the first roll unit comprises a plurality of substantially planar surfaces sized to hold a single wafer of a solar cell. The first roll unit 120 can comprise any desirable material, for example, metal, plastic, ceramic, graphite or a combination thereof. The first roll unit 120 is configured to rotate about an axis and can be driven by a motor providing power to the first roll unit 120. In one embodiment, the motor provides power to steadily rotate the first roll unit 120. In other embodiments, the first roll unit 120 can rotate intermittently, or in an indexed manner. The magnitude of the indexing motion of the first roll unit can be adjusted as desired. In some embodiments, a roll unit comprises a single roller; however in other embodiments, a roll unit can comprises a plurality of rollers.

The diameter and width of the first roll unit can be of any desirable dimensions. In one embodiment, the first roll unit is sized to hold, support and/or maintain a plurality of wafers in a predetermined cell string matrix or arrangement of a solar module. In several embodiments, the number of cells or length of a cell string is greater than the number of cells that are maintained on the first roll unit at any one time. For example, a cell string can comprise 10 or more solar cells with the first roll unit holding 9 cells at once as depicted in FIG. 2.

In an embodiment, the dimensions of the first roll unit are determined based on the dimensions of the wafers or solar cells. As a non-limiting example, the wafers can be 12-16 cm in width. In one embodiment, the gap between adjacent cells in a solar cell string can be less than 2 mm. In another embodiment, the gap between adjacent cells in a solar cell string can be less than 1 mm, for example approximately 0.5 mm.

In one embodiment, a wafer can be provided on the first roll 120 unit which is heated to a predetermined temperature. The first roll unit 120 can transfer thermal energy to wafers 112a-n in contact with the first roll unit 120. In some embodiments, wafers 112 can be heated or "pre-heated" before coming into contact with the first roll unit 120. Any desirable heating mechanism can be employed, for example, conduction, convection, radiative e.g. infrared, and/or induction heating.

Referring to operation 104 of flowchart 100 and to corresponding FIG. 2, a method of fabricating a solar cell or solar cell string comprises conveying a metal foil 132 from a second roll unit 130 to the first roll unit 120 along a second conveyance path 122'. As depicted in FIG. 2, a continuous length of the metal foil 132 is unrolled from the second roll unit 130 and transported along a second conveyance path 122' to the first roll unit 120 to contact the back side 116 of wafer of solar cell 112n along the first conveyance path 122. As depicted, the second conveyance path 122' merges with the first conveyance path at the position of solar cell 112n. In some embodiments, a one or more guide rollers can be employed to guide the metal foil along a second conveyance path 122' from the second roll unit to the first roll unit. In various embodiments, foil 132 is heated to a predetermined temperature along the second conveyance path. In one embodiment, the foil is heated at the second roll unit 130 heated to a predetermined temperature. Any desirable heating mechanism can be employed, for example, conduction, convection, radiative e.g. infrared, and/or induction heating.

In various embodiments, the metal foil 132 is an aluminum (Al) foil having a thickness less than 200 μm. As another example, the metal foil can have a thickness approximately in the range of 5-100 microns. In one embodiment, the metal foil is an aluminum alloy foil including aluminum and second element such as, but not limited to, copper, manganese, silicon, magnesium, zinc, tin, lithium, or combinations thereof. In one embodiment, the aluminum foil is a temper grade foil such as, but not limited to, F-grade (as fabricated), O-grade (full soft), H-grade (strain hardened) or T-grade (heat treated). In one embodiment, the aluminum foil is an anodized aluminum foil. In some embodiments, the metal foil is selected from the group of aluminum, copper, nickel, manganese, silicon, magnesium, zinc, tin, lithium, or combinations thereof.

In an embodiment, the second roll unit is an elongated cylindrical device comprising a circular cross-section such as depicted in FIG. 2. As depicted, the second roll unit 130 is a roll of metal foil that is continuously unrolled and conveyed to the first roll unit 120 to contact the wafer of solar cell 112n. The second roll unit 130 can comprise any desirable material, for example, metal, plastic, ceramic, graphite or a combination thereof. The second roll unit 130 is configured to rotate about an axis and can be driven by a motor providing power to rotate the second roll unit 130. As it would become apparent to those skilled in the art (e.g. web converting arts), the second roll unit can be rotated in any desirable manner so as to maintain tension on the foil section 132. For example, a clutch and counter rotation motor, or brake in combination with a tension measuring device, such as a 'dancer' roller can be employed. Referring to operation 106 of flowchart 100 and to corresponding FIG. 2, a method of fabricating a solar cell or solar cell string comprises coupling the metal foil to the wafer to provide a unified pairing of the metal foil and the wafer, thereby forming a metallized solar cell or solar cell string. In one embodiment, the metal foil is fixedly coupled or bonded to the back sides 116 of the wafer of solar cell 112n by applying a mechanical force 140 directed towards the wafer 112n on the first roller unit 120 as depicted in FIG. 2. For example a mechanical force 140 can be applied to a bonding head, a bonding roller, a bonding plate or a bonding paddle directed towards solar cell 112n. In other embodiments, operation 106 comprises a laser welding process wherein the metal foil 132 is coupled or bonded to the wafer 112n by impinging a laser beam on the metal foil 132 to weld the metal foil to the wafer 112n. In yet other embodiments, an ultrasonic bonding or welding process can be employed to couple the metal foil 132 to the wafer 112n. Any desirable mechanism can be used to bond the metal foil to the wafer. In one embodiment, the resulting bond can be characterized as having an interface adhesion energy of greater than 4 Joules/m$^2$.

In an embodiment, the metal foil is coupled to the wafer of solar cell at 112n to produce a solar cell string 150 comprising a metal foil interconnect between each of the plurality of solar cells. In some embodiments, step 106 comprises applying a force to the metal foil such that a shear force appears between the metal foil and the surface of the wafer to electrically connect a substantial portion of the metal foil with the surface of the wafer. In some embodiments, the method comprises a step of dispensing a conductive adhesive at the metal foil interconnect between the plurality of cells.

In an embodiment, a parallel plate press of a metal foil by a flat bonding head onto the wafer may not produce an optimal bond between the wafer and the metal foil. Instead, although not to be bound by theory, in accordance with one or more embodiments described herein, application of first point force or pressure and then a shear force or pressure at step 106 can provide for improved coupling or bonding. Not to be bound by any particular theory, but this approach allows the metal foil to locally stretch at the interface, in some instances breaking a passivating oxide and allowing the metal foil to "stick" to the underlying wafer.

In various embodiments, the plurality of wafers are heated to a predetermined temperature before and/or during step 102 and/or 106 of flowchart 100. In one embodiment, a wafer can be provided on the first roll 120 unit which is heated to a predetermined temperature. The first roll unit 120 can transfer thermal energy to wafers 112a-n in contact with the first roll unit 120. In some embodiments, wafers 112 can be heated or "pre-heated" before coming into contact with the first roll unit 120. Any desirable heating mechanism can be employed, for example, conduction, convection, radiative e.g. infrared, and/or induction heating.

In various embodiments, the metal foil 132 is heated to a predetermined temperature before and/or during step 104 and/or step 106 of flowchart 100. In one embodiment, the metal foil 132 can be heated before or during conveying the metal foil 132 to the first roll unit 120. For example, the second roll unit 130 can transfer thermal energy to the metal foil 132. In some embodiments, the metal foil 132 can be heated in the process of being conveyed to the first roll unit 120.

In several embodiments, solar cell 112n and/or the metal foil 132 are heated to a predetermined temperature during the step 106 of coupling the metal foil to the solar cell 112n. In an embodiment, the solar cell 112n and the metal foil 132 are heated to a predetermined bonding temperature during the coupling or bonding step 106. For example, a mechanical force 140 can be applied to a heated bonding head, a heated bonding roller, a heated bonding plate or a heated bonding paddle directed towards solar cell 112n. As described above, the first roll unit 120 can be heated so as to conduct heat to the wafer and/or foil.

The wafer of the solar cell and/or the metal foil as well as the roll units can be heated to any desired temperature. In some embodiments, the predetermined temperature can be approximately in the range of 100-600° C. As another example, the predetermined temperature can be approximately in the range of 350-580° C.

FIG. 1 and FIG. 2 illustrate approaches to fabricating solar cells using roll-to-roll foil-based metallization according to one embodiment. Unless otherwise designated, the steps and components of FIG. 4-9 are similar, except that they have been incremented sequentially by 100.

Figure 4:
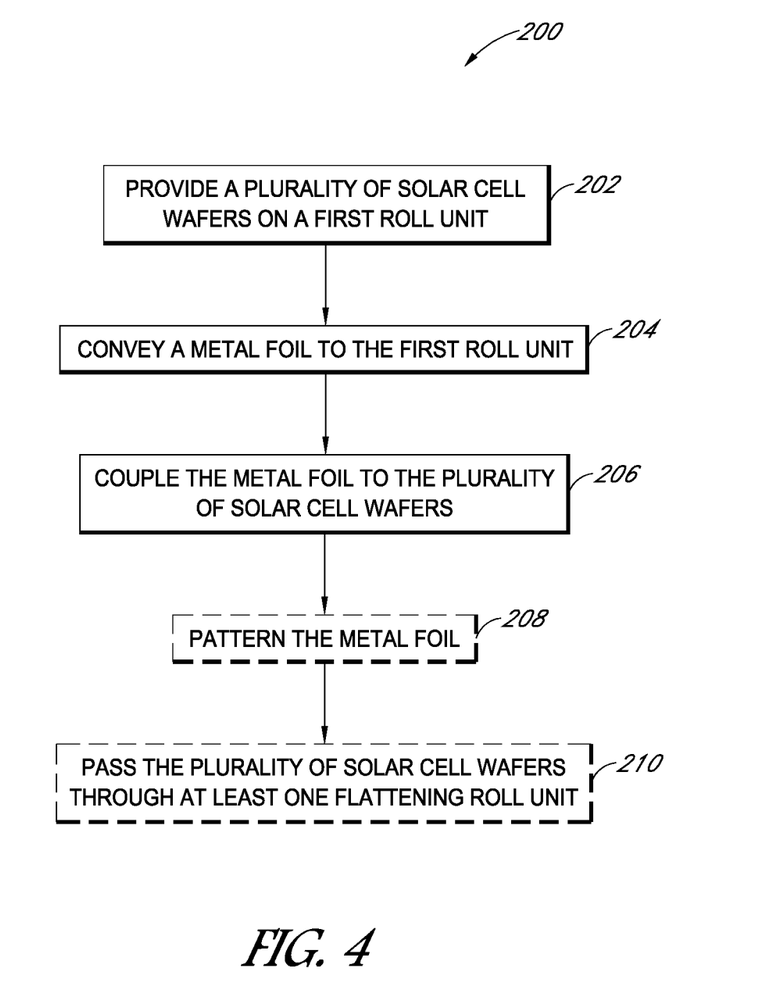
FIG. 4 depicts operations in a method of fabricating a solar cell string or solar module, in accordance with an embodiment of the present disclosure.

FIG. 4 depicts a flowchart 200 listing operations in a method of fabricating a solar cell string or solar module, in accordance with an embodiment of the present disclosure. Optional operations of flowchart 200 are indicated by dashed lines. Referring to operation 202 of flowchart 200 and to corresponding FIG. 5, a method of fabricating a solar cell string or solar module comprises providing a plurality of solar cells 212 on a first roll unit 220. The first roll unit 220 rotates the solar cells 212 along a first conveyance path generally depicted at 222.

Figure 5:
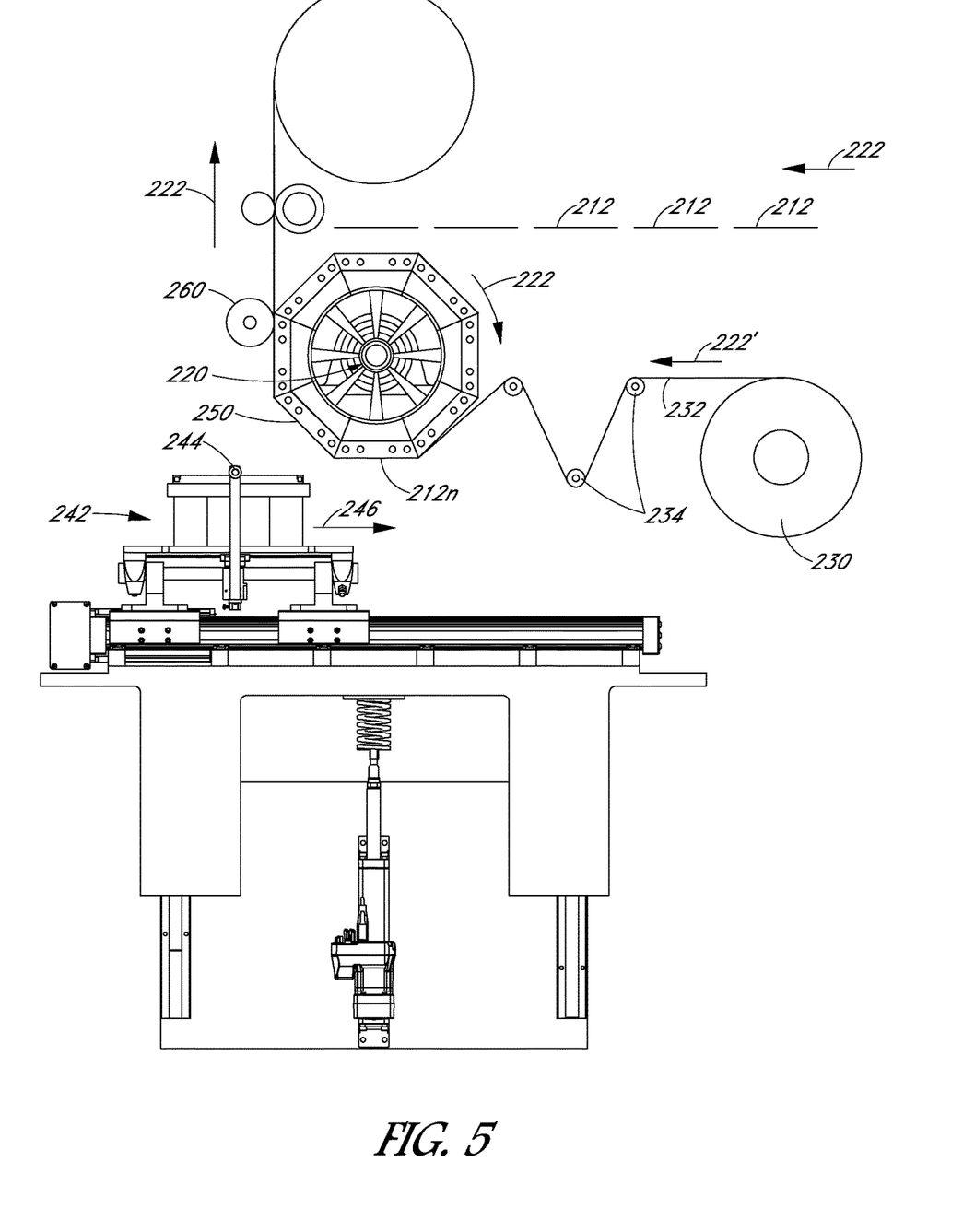
FIG. 5 depicts a method of fabricating a solar cell string or solar module, in accordance with an embodiment of the present disclosure.

In one embodiment, the first roll unit comprises a plurality of substantially planar surfaces sized to maintain, hold or support a single wafer of a solar cell. For example, the first roll unit 220 comprises eight substantially planar surfaces defining an octagonal cross-section, however any desirable number of substantially planar surfaces in any desirable configuration can be employed. As depicted in FIG. 5, each substantially planar surface of first roll unit 220 is sized to hold a single wafer of a solar cell 212. In other embodiments, a substantially planar surface of a first roll unit can be sized to hold a plurality of wafers in any desirable configuration. The first roll unit 220 is configured to rotate (e.g. clockwise as depicted in FIG. 5) about an axis to transport the solar cells 212 along the first conveyance path 222.

In an embodiment, the first roll unit can maintain, hold or support wafers by any desirable gripping, grasping, or releaseably coupling device or technique. For example, directing a stream of gas towards the cell, a gripping mechanism with electro-mechanical grasping elements and/or a vacuum interface for holding an object against itself can be used. In some embodiments, providing a wafer on the first roll unit comprises applying a vacuum suction to hold a wafer on the first roll unit, wherein the first roll unit comprises conduits or tunnels for evacuating air to produce a vacuum suction through the conduit or tunnel; thereby holding a wafer of a solar cell in place while on the first roll unit.

Figure 6:
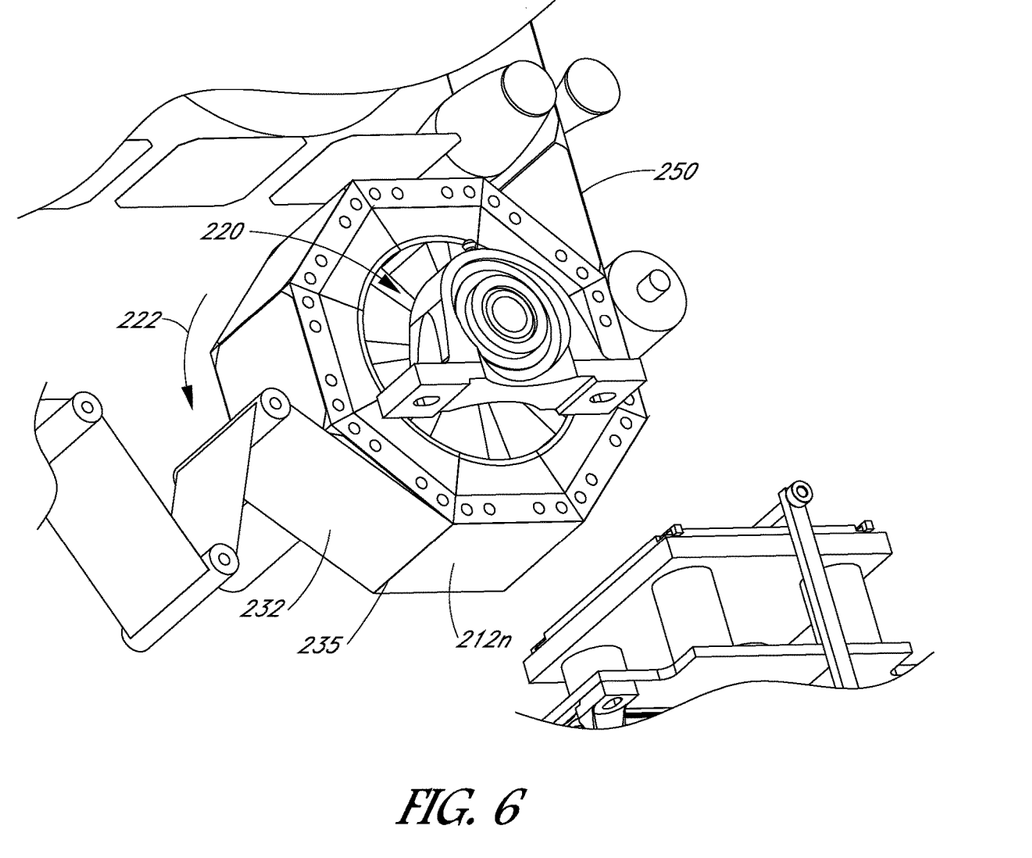
FIG. 6 depicts a method of fabricating a solar cell string or solar module, in accordance with an embodiment of the present disclosure.
Figure 7:
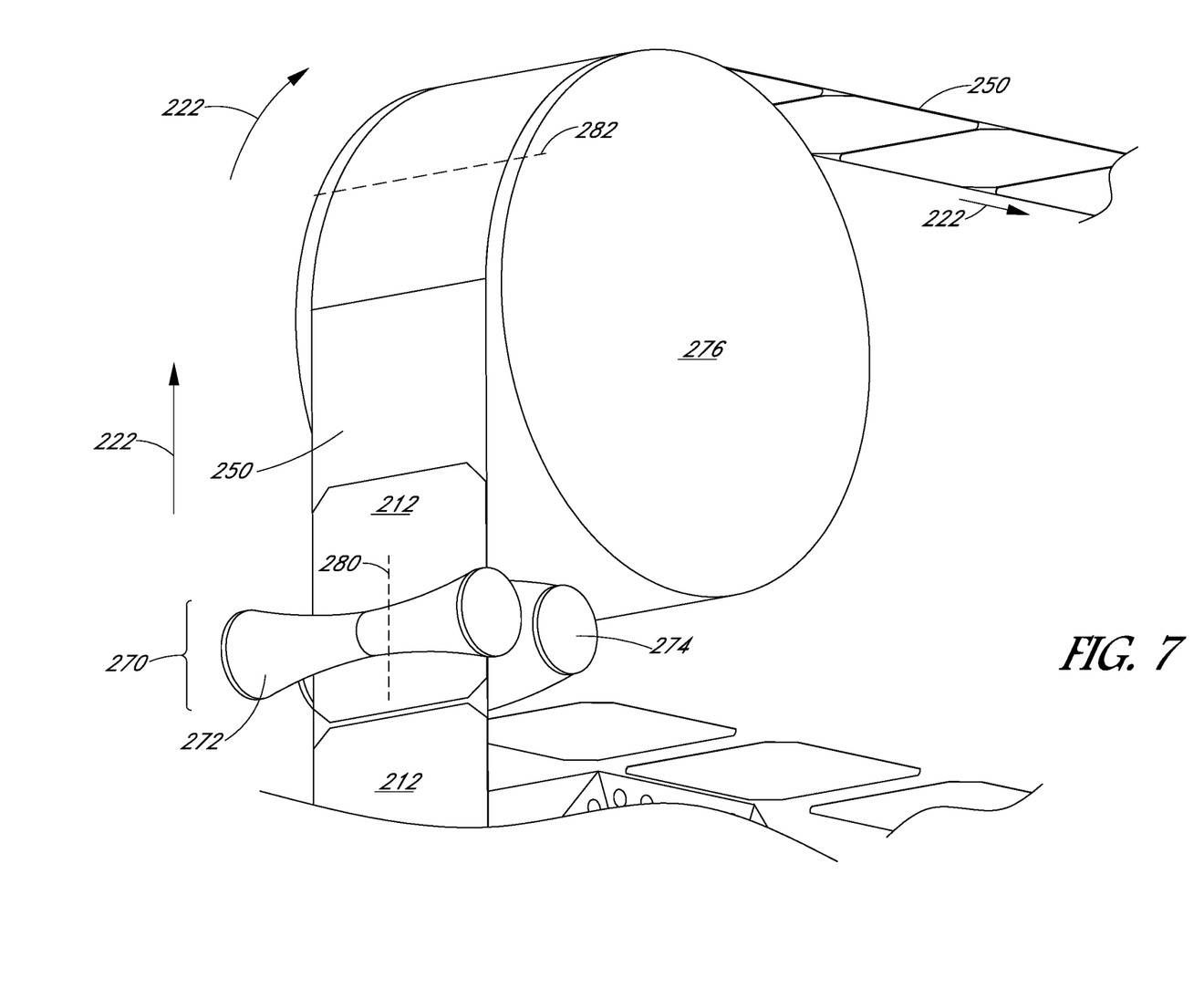
FIG. 7 depicts a method of fabricating a solar cell string or solar module, in accordance with an embodiment of the present disclosure.

Referring to operation 204 of flowchart 200 and to corresponding FIG. 5, a method of fabricating a solar cell string or module comprises conveying a metal foil 232 from a second roll unit 230 to the first roll unit 220. As depicted in FIG. 2, a continuous length of the metal foil 232 is unrolled from the second roll unit 230 and transported to the first roll unit 220 to contact solar cells 212 being transported along the first conveyance path 222. As depicted, the second conveyance path 222' merges with the first conveyance path at the position of solar cell 212n. A plurality of guide rollers 234 unit can be employed to guide the metal foil 232 along the second conveyance path 222' from the second roll unit 230 to the first roll unit 220. In an embodiment, the metal foil 232 is tensioned or stretched at an angle on a corner or edge 235 between two substantially planar sections of the first roll unit 220 as depicted in FIG. 6. The edge 235 can constrain the foil 235, thereby voiding formation of out-of-plane undulations. Any suitable mechanism and/or structure can be used to prevent wrinkles from forming in the foil a232 before being coupled to the wafer 212n.

Referring to operation 206 of flowchart 100 and to corresponding FIG. 5, a method of fabricating a solar cell string or module comprises coupling the metal foil 232 to the wafer of a solar cell at position 212n to provide a unified pairing of the metal foil 232 and the wafer 212n. At step 206, the metal foil 232 can be coupled to the plurality of solar cells 212 to produce a solar cell string 250 comprising a metal foil interconnect between each of the plurality of solar cells 212. In one embodiment, the metal foil 232 is fixedly coupled to solar cell 212n by applying a mechanical force directed towards the first roller unit 220. In one embodiment, a parallel plate press of the metal foil 232 by a flat bonding head is applied to wafer 212n. In other embodiments, a bonding roller can roll across the surface of the metal foil 232 while applying a force directed towards first roll unit 220, thereby bonding metal foil 232 to wafer of solar cell 212n.

Not to be bound by any particular theory, but a parallel plate press may not produce an optimal bond between the wafer and the metal foil. Instead, in accordance with one or more embodiments described herein, application of first point force or pressure and then a shear force or pressure at step 206 can provide for improved coupling or bonding. Not to be bound by any particular theory, but this approach allows the metal foil to locally stretch at the interface, in some instances breaking a passivating oxide and allowing the metal foil to "stick" to the underlying wafer.

As depicted in FIG. 5, a mechanical force is applied to the solar cell 212n by a bonding head 242 comprising a bonding roller 244. The bonding head is configured to direct the bonding roller against solar cell 212n along the direction indicated by 246. In various embodiments, the direction of the bonding head or roller can be in a direction opposite or perpendicular to direction 246 depending on the desired coupling mechanism and/or configuration.

In several embodiments, solar cell 212n and/or the metal foil 232 are heated to a predetermined temperature during coupling the metal foil to the solar cell 212n at step 206. For example, a heated bonding head and/or bonding roller to a predetermined bonding temperature approximately in the range of 100-600° C. As another example, the predetermined bonding temperature can be approximately in the range of 350-580° C. Such thermo-compression approaches may be performed to provide thermo-compression bonding of an aluminum (or other metal) foil directly to a substrate or wafer of a solar cell. In one embodiment, the metal foil can be coupled to the bottom anti-reflective coating (BARC) material or other protective layer (such as a layer amorphous silicon). Additionally, thermo-compression bonding can be employed to bond a metal foil directly to a sputtered metal seed layer on a substrate or wafer of a solar cell.

Figure 3B:
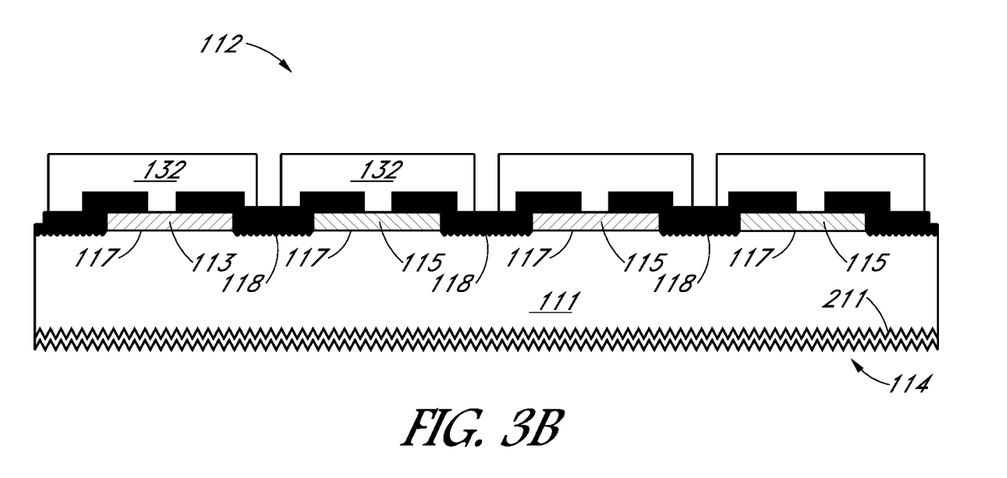

In various embodiment, the ultimate metallization layer for fabricating electrical contacts for a solar cell is a metal foil layer, such as an aluminum metal foil. A metal foil can be patterned to provide electrical contacts, metallization structures and/or fingers for underlying semiconductor regions of a solar cell. For example, the metal foil 132 can be patterned at locations between a plurality of semiconductor regions 113/115 as depicted in FIG. 3B. The metal foil 132 comprises electrically isolated regions which are metallization structures, each in electrical contact with alternating semiconductor regions 113/115.

In some embodiments, the metal foil is "pre-patterned" or patterned before being coupled to the solar cell wafer such that a metal foil comprising a pattern of electrically isolated regions is conveyed to the first roll unit and aligned with desired regions of the solar cell upon contact. However, in other embodiments, the metal foil can be patterned after being coupled to the wafer of the solar cell.

As used herein, electrical isolation refers to physically separating portions of a metal foil and/or metal seed layer such that electrical conduction across a groove, indentation and/or trench is not possible or is otherwise impractical. However, metallization structures or fingers may be connected so as to conduct electrical current through other pathways, for example electrical conduits like bus bars which can be provided in any desired configuration.

In some embodiments, the metal foil can be patterned during or substantially simultaneously as the step of bonding of the metal foil to the solar cell at 206. In yet other embodiments, the metal foil can be patterned at optional step 208 of flowchart 200 in FIG. 4. In one embodiment, patterning is a continuous process employing a patterning roller unit or a rotary cutting die having a generally curved or arcuate cross-section to isolate metal foil regions to form metallization structures on each solar cell and/or trim excess metal foil to define interconnects between adjacent solar cells. As additional examples, a rotary die, flexible die or rigid planar die is pressed into the metal foil to form a pattern. In the example depicted in FIG. 5, a patterning roller 260 rolls across solar cell string 250 while applying a mechanical force on metal foil 232 of solar cell string 250.

In some embodiments, the patterning roller 260 comprises cutter blades having any desirable shape, size, or configuration. The patterning roller and/or cutter blade(s) of a rotary cutting die can be provided in any desired pattern or configuration to electrically isolate metal foil regions, electrically isolate metal seed regions and/or trim of excess metal foil during a patterning operations.

The patterning may not necessarily be done prior to the bonding step 206 or simultaneously with the bonding step 206. For example, the patterning step could be a separate screen printing or die cutting step performed on the cell string 250 subsequent to its manufacture.

In an embodiment, the cell string 250 comprises at least a portion of metal foil 232 remaining intact between adjacent solar cells 212. The metal foil 232 spanning between adjacent solar cells 212 can be electrically conductive interconnects of a solar cell string or module. In some embodiments, the metal foil can be patterned or trimmed at locations between the solar cells while still maintaining electrically conductive foil interconnects between cells, for example to provide strain relief elements. In some embodiments, the foil between adjacent solar cells can be substantially entirely cut after a predetermined number of sequential solar cells form a cell string, for example to produce a plurality of cell strings with each solar cell string being 8-16 solar cells long. However, in yet other embodiments where individual solar cells are desired, the metal foil can be cut between each solar cell.

At optional step 210 in flowchart 200 of FIG. 4, the method of forming a solar cell string or module comprises passing the plurality of solar cells in a solar cell string through at least one flattening roll unit to induce a flat orientation. In the exemplary embodiment of FIG. 7, the solar cell string 250 is passed through a third roll unit 270 comprising two rollers 272/274 located on either side of solar cell string 250. The third roll unit contacts or presses solar cell string 250 to induce a flat orientation around a first axis 280 parallel to the first conveyance path 222. Additionally, the solar cell string 250 is passed through a fourth large diameter roll unit 276 located on the side of the solar cell string 250 opposite the metal foil. The fourth roll unit contacts or presses solar cell string 250 to induce a flat orientation around a second axis 282 perpendicular to the first conveyance path 222. The solar cell string can be passed through any desirable number of flattening roll units comprising any number of rollers and having any desirable orientation or size to induce a flat orientation. In various embodiments, the wafer or solar cell can be characterized by a predetermined curvature substantially equivalent to the curvature of the first roll unit.

Not to be bound by any particular theory, but due to non-uniform thermal properties of the foil and wafer of a solar cell string, heating or annealing operations, e.g. while coupling metal foil and wafer, can result in a bent or bowed solar cell string during cooling to room temperature. Thus, the solar cell string can be passed through any desirable number of flattening units in any order to induce a flat orientation around any suitable axis. In some embodiments, the solar cell wafers can be by "pre-bent" or "pre-tensioned" in advance of providing the solar cell wafers on the first roll unit by applying a force to deform the wafers into an initial orientation.

Figure 8:
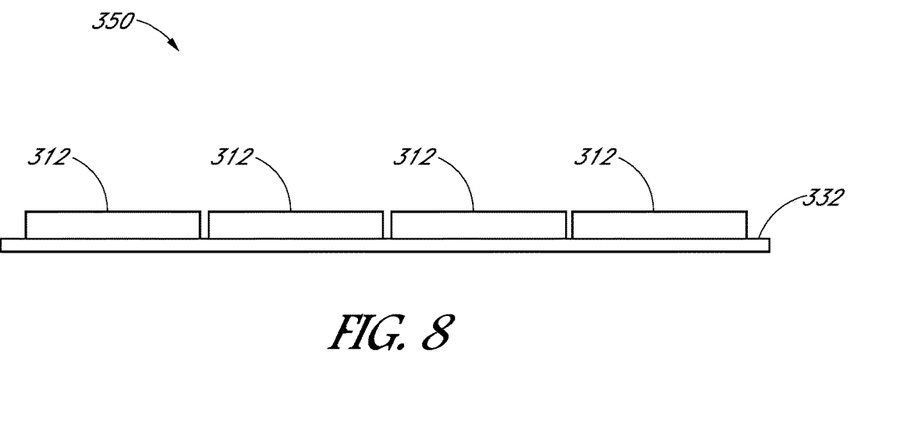
FIG. 8 depicts a solar cell string, in accordance with an embodiment of the present disclosure.
Figure 9:
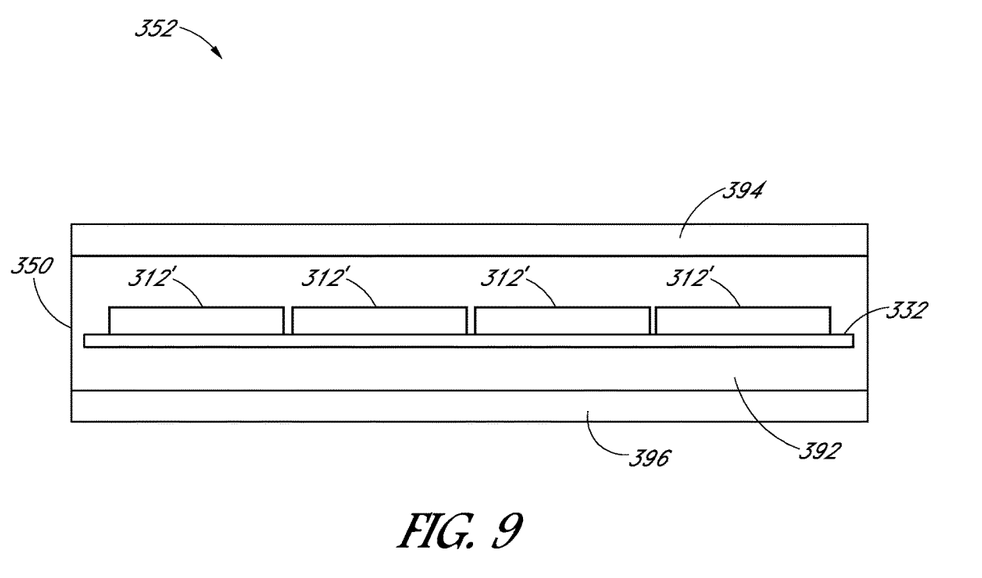
FIG. 9 depicts a solar module, in accordance with an embodiment of the present disclosure.

Disclosed herein is a solar or photovoltaic module and a method of manufacturing thereof. The method of manufacturing a solar module comprises a step of providing a plurality of solar cells on a first roll unit configured to maintain the plurality of solar cells in a predetermined cell string arrangement of the solar module. For example, FIG. 8 depicts a solar cell string 350 comprising a plurality of solar cells 312 interconnected by a metal foil 332. The solar cell string 250 can be encapsulated by an encapsulant 392 in any desirable cell string arrangement to form a photovoltaic laminate or module 352. FIG. 9 depicts a solar laminate or module 352 comprising a solar cell string 350 encapsulated between a superstrate (e.g. glass) 394 and a backsheet 396.

The above specification and examples provide a complete description of the structure and use of illustrative embodiments. Although certain embodiments have been described above with a certain degree of particularity, or with reference to one or more individual embodiments, those skilled in the art could make numerous alterations to the disclosed embodiments without departing from the scope of this invention. As such, the various illustrative embodiments of the methods and systems are not intended to be limited to the particular forms disclosed. Rather, they include all modifications and alternatives falling within the scope of the claims, and embodiments other than the one shown can include some or all of the features of the depicted embodiment. For example, elements can be omitted or combined as a unitary structure, and/or connections can be substituted. Further, where appropriate, aspects of any of the examples described above can be combined with aspects of any of the other examples described to form further examples having comparable or different properties and/or functions, and addressing the same or different problems. Similarly, it will be understood that the benefits and advantages described above can relate to one embodiment or can relate to several embodiments. For example, embodiments of the present methods and systems can be practiced and/or implemented using different structural configurations, materials, and/or control manufacturing steps. The claims are not intended to include, and should not be interpreted to include, means-plus- or step-plus-function limitations, unless such a limitation is explicitly recited in a given claim using the phrase(s) "means for" or "step for," respectively.

The invention claimed is:

1. A method of fabricating a solar cell, the method comprising:
   providing a solar cell on a first roll unit, the solar cell comprising a plurality of semiconductor regions;
   conveying a metal foil directly to the first roll unit without contacting the first roll unit, wherein the metal foil contacts the solar cell on the first roll unit;
   coupling the metal foil to the solar cell to provide a unified pairing of the metal foil and the solar cell; and
   patterning the metal foil coupled to the solar cell.

2. The method according to claim 1, wherein providing the solar cell on the first roll unit comprises providing the solar cell on the first roll unit heated to a predetermined temperature.

3. The method according to claim 2, wherein the predetermined temperature is in the range of 100-600° C.

4. The method according to claim 1, further comprising heating the solar cell prior to providing the solar cell on the first roll unit, heating the metal foil prior to conveying the metal foil to the first roll unit, or a combination thereof.

5. The method according to claim 1, wherein providing the solar cell on the first roll unit comprises applying a vacuum suction to hold the solar cell on the first roll unit.

6. The method according to claim 1, wherein conveying the metal foil to the first roll unit comprises conveying an aluminum foil to the first roll unit.

7. A method of manufacturing a solar cell string, the method comprising:
providing plurality of solar cells on a first roll unit;
conveying a metal foil directly to the first roll unit without contacting the first roll unit, wherein the metal foil contacts a solar cell of plurality of solar cells on the first roll unit; and
coupling the metal foil to the solar cell of plurality of solar cells to form a solar cell string.

8. The method according to claim 7, wherein providing the plurality of solar cells on the first roll unit comprises providing the plurality of solar cells on the first roll unit heated to a predetermined temperature.

9. The method according to claim 8, wherein the predetermined temperature is in the range of 100-600° C.

10. The method according to claim 8, further comprising heating the plurality of solar cells prior to providing the plurality of solar cells on the first roll unit, heating the metal foil prior to conveying the metal foil to the first roll unit, or a combination thereof.

11. The method according to claim 10, wherein conveying the metal foil to the first roll unit comprises conveying an aluminum foil to the first roll unit.

12. The method according to claim 8, wherein providing the plurality of solar cells on the first roll unit comprises applying a vacuum suction to hold the plurality of solar cells on the first roll unit.

13. The method according to claim 8, wherein conveying the metal foil to the first roll unit comprises conveying an aluminum foil to the first roll unit.

14. A method of manufacturing a solar module, the method comprising:
providing plurality of solar cells on a first roll unit;
conveying a metal foil directly to the first roll unit without contacting the first roll unit, wherein the metal foil contacts a solar cell of plurality of solar cells on the first roll unit;
coupling the metal foil to the solar cell of plurality of solar cells to form a solar cell string; and
encapsulating the cell string arrangement to form a photovoltaic laminate.

15. The method according to claim 14, wherein providing the plurality of solar cells on the first roll unit comprises providing the plurality of solar cells on the first roll unit heated to a predetermined temperature.

16. The method according to claim 15, wherein the predetermined temperature is in the range of 100-600° C.

17. The method according to claim 14, further comprising heating the plurality of solar cells prior to providing the plurality of solar cells on the first roll unit, heating the metal foil prior to conveying the metal foil to the first roll unit, or a combination thereof.

18. The method according to claim 17, wherein conveying the metal foil to the first roll unit comprises conveying an aluminum foil to the first roll unit.

19. The method according to claim 14, wherein providing the plurality of solar cells on the first roll unit comprises applying a vacuum suction to hold the plurality of solar cells on the first roll unit.

20. The method according to claim 14, wherein conveying the metal foil to the first roll unit comprises conveying an aluminum foil to the first roll unit.

\* \* \* \* \*